(12) United States Patent
Konijn et al.

(10) Patent No.: US 7,304,477 B2
(45) Date of Patent: Dec. 4, 2007

(54) MRI APPARATUS WITH MEANS FOR NOISE REDUCTION

(75) Inventors: Jan Konijn, Eindhoven (NL); Cornelis L. G. Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/595,921

(22) PCT Filed: Nov. 17, 2004

(86) PCT No.: PCT/IB2004/052454

§ 371 (c)(1),
(2), (4) Date: May 19, 2006

(87) PCT Pub. No.: WO2005/050238

PCT Pub. Date: Jun. 2, 2005

(65) Prior Publication Data

US 2007/0080689 A1    Apr. 12, 2007

(30) Foreign Application Priority Data

Nov. 24, 2003   (EP)   ................... 03104331

(51) Int. Cl.
*G01V 3/00*   (2006.01)

(52) U.S. Cl. ...................... 324/318; 324/319

(58) Field of Classification Search ............... 324/318, 324/319, 320, 322
See application file for complete search history.

(56) References Cited

U.S. PATENT DOCUMENTS

| | | | |
|---|---|---|---|
| 6,075,363 A | 6/2000 | Sellers et al. | |
| 6,111,412 A | 8/2000 | Boemmel et al. | |
| 6,525,537 B2 | 2/2003 | Nerreter | |
| 6,642,717 B2 * | 11/2003 | Dietz et al. | 324/318 |
| 2002/0148604 A1 | 10/2002 | Emeric et al. | |

FOREIGN PATENT DOCUMENTS

JP    2169637 A    6/1990

* cited by examiner

*Primary Examiner*—Louis M. Arana

(57) ABSTRACT

A magnetic resonance imaging (MRI) system includes a main magnet system for generating a main magnetic field in an examination volume. A gradient coil system is arranged between the main magnet system and the examination volume and includes sub-gradient coils embedded in a binding material which has a glass temperature. A controller controls a temperature of the gradient coil system. A temperature-influencing unit influences the temperature of the gradient coil system on the basis of control signals supplied by the control unit. The control unit and the temperature-influencing unit control the temperature of the binding material of the gradient coil system to a value above the glass temperature during operation of the MRI system.

19 Claims, 4 Drawing Sheets

MRI APPARATUS WITH MEANS FOR NOISE REDUCTION

Figure 1:
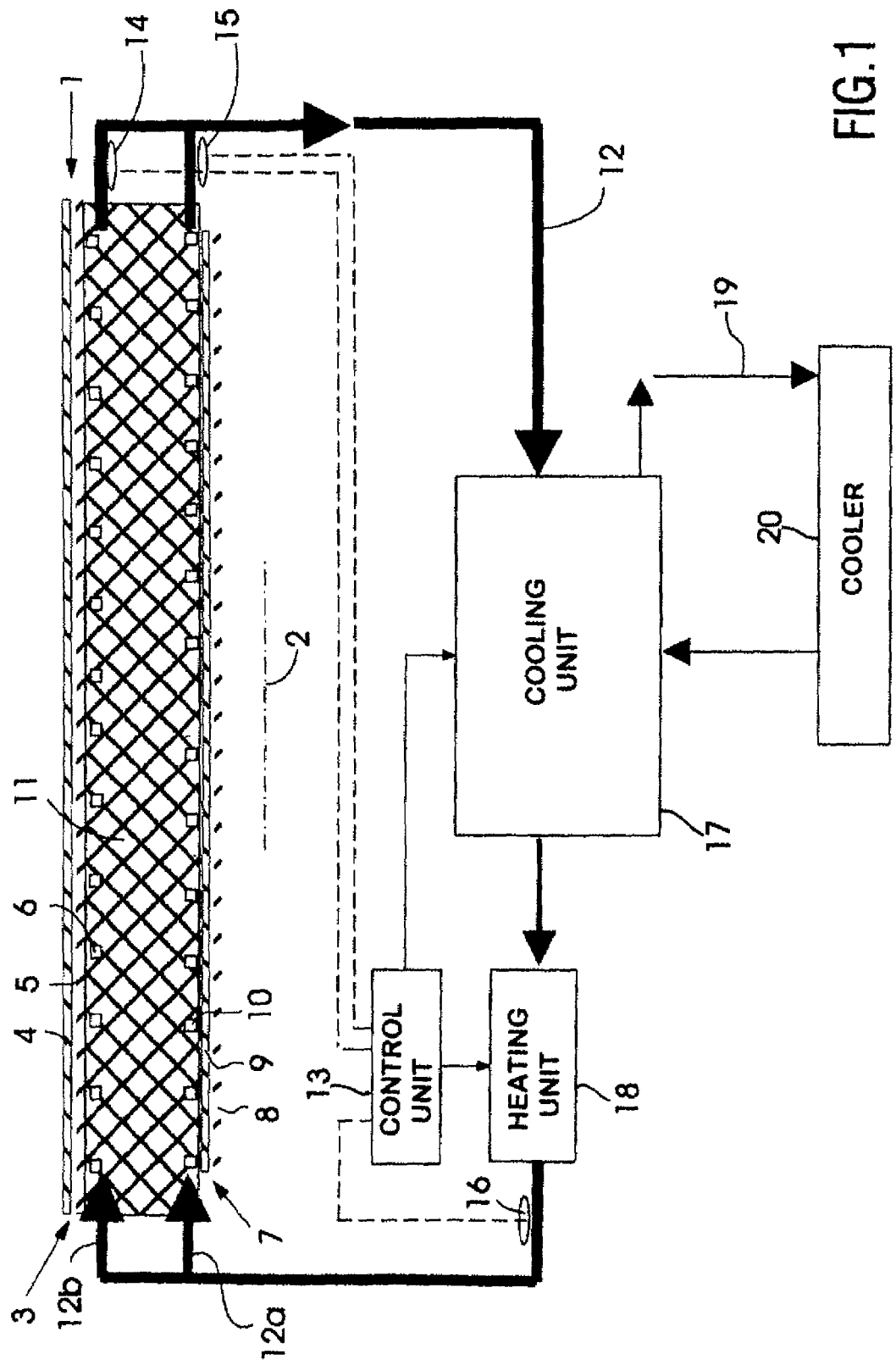

The invention relates to a magnetic resonance imaging (MRI) apparatus comprising a main magnet system for generating a main magnetic field in an examination space, a gradient coil system which is situated basically between the main magnet system and the examination space and which is provided with sub-gradient coils and a binding material having a glass temperature for keeping the sub-gradient coils together, control means for controlling the temperature of the gradient coil system, and temperature-influencing means for influencing, on the basis of control signals originating from the control means, the temperature of the gradient coil system.

Such an MRI apparatus is known from United States patent application US 2002/0148604 A1. The gradient coil system of MRI apparatuses generally tends to heat up during operation, due to the alternating currents passing through the various sub-gradient coils. This heating up is deemed undesirable for various reasons. For example, the binding action of the binder material, frequently an epoxy resin, will rapidly deteriorate above a certain temperature which, in any case, is higher than the glass temperature of the binder material used, so that the very inconvenient risk exists of delamination causing disintegration of the gradient coil system. The glass temperature, also referred to as glass transition temperature, is a term known to those skilled in the art of (synthetic resin) binder materials; when this temperature is exceeded the binder material softens, as it were, leading to a substantial decrease of the E modulus of the binder material. The glass temperature for certain types of synthetic resin materials is listed in tables, which are known to the supplier of such materials and/or can be experimentally determined. An excessive rise in temperature of the gradient coil system should be precluded, not only to preclude undesirable delamination of the gradient coil system, but also because it is desirable from the point of view of comfort, so that a patient present in the examination space experiences the temperature as comfortable or at least as bearable.

To make sure that, for the reasons stated above, the temperature does not rise too much it is generally known to cool a gradient coil system. The most common way of cooling the gradient coil system is with a cooling circuit through which a cooling liquid is passed, which cooling circuit extends through the gradient coil system. The allowable degree of cooling of the gradient coil system is limited due to the risk of condensation, which may occur below a certain temperature of the gradient coil system which depends on the relative humidity and the temperature of the ambient air. In practice this means that cooling takes place to ambient temperature or a few degrees below ambient temperature.

The MRI apparatus according to the above-mentioned United States patent application US 2002/01486014 A1 comprises a cooling circuit which extends partly through the gradient coil system. To ensure that an increased cooling capacity can be obtained for "high-power" imaging/scanning involving the generation of a comparatively high power in the gradient coil system, the MRI apparatus is provided with a housing for the gradient coil system, within which a vacuum is created. Because of said vacuum, the dew point temperature within the housing is decreased substantially, so that also the temperature of the cooling medium in the cooling circuit can be brought to a lower value than would have been possible without the vacuum housing, because, without said vacuum housing, undesirable condensation could occur on the gradient coil system. Said United States patent application states generally that the MRI apparatus described therein enables the temperature of the cooling medium to be adjusted in dependence on the cooling need independent of the dew point temperature of the environment.

An entirely different, important aspect of MRI apparatus in general is formed by the degree to which they produce noise during operation. This noise production is caused to a substantial degree by the fact that alternating currents having a frequency ranging typically between 0 and 1.5 kHz, i.e. in the audible range, are passed through the sub-gradient coils of the gradient coil system. These alternating currents result in varying Lorentz forces, which lead to vibrations and noise production of the gradient coil system, particularly in the case of resonances. A patient in the examination space may experience such noise as very unpleasant, which is the reason why it is important to limit the production of noise as much as possible.

It is an object of the invention to provide an MRI apparatus of the type set forth in the opening paragraph, by means of which a substantial noise reduction can be readily achieved during operation of the MRI apparatus.

To achieve this object, an MRI apparatus according to the invention is characterized in the first place in that the control means are arranged for controlling, during operation of the MRI apparatus, the temperature of the binding material of the gradient coil system to a value above the glass temperature. The invention is based, on the one hand, on the recognition that binding materials such as those customarily used for gradient coil systems of MRI apparatus obtain a substantial damping effect, at temperatures above the glass temperature, on the vibrations of the sub-gradient coils which, in operation, may give rise to unacceptable noise production and, on the other hand, on the recognition that cooling of the gradient coil system to a temperature comparatively slightly higher than the dew point temperature may be more unfavorable than cooling of the gradient coil system to a higher temperature. Of course, care must be taken that the temperature of the gradient coil system, or more specifically of the binding material thereof, does not rise to a level above which the binding properties of the binder material decrease to such extent that the risk of delamination of the gradient coil system becomes unacceptably high. Like the glass temperature, the limiting value of this maximally permissible temperature of the binder material depends on the type of binder material used.

Preferably, the value of the glass temperature is at least 30° C. Such a glass temperature is in keeping with that of commercially available binder materials, with specific types of binder material having a glass temperature of, for example, 40° C., 45° C., 50° C. or even higher.

Preferably, the temperature-influencing means comprise heating means for the gradient coil system. It is thus achieved that the binder material of the gradient coil system can always adopt an increased temperature (i.e., also if the MRI apparatus in question is out of use for a prolonged period of time), so that even at the beginning of a scanning operation the temperature of the gradient coil system already adopts an increased value as a result of which the advantageous, damping properties of the binding material, as described above, already occur, while the temperature of the gradient coil system without the use of the heating means would be equal, for example, to the ambient temperature of, for example 20° C. Such heating means could also consist of, for example, means for sending a direct current through the sub-gradient coils, as a result of which, due to resistance heating, the temperature of the sub-gradient coils and hence of the binder material already exhibits an increase.

In accordance with a further preferred embodiment, the temperature-influencing means and the control means are arranged so as to be able to influence, to a different degree, the temperature of respective, different parts of the gradient coil system. This preferred embodiment is based on the recognition that it is not always desirable to preclude the development of temperature gradients in the gradient coil system. This can be illustrated by the situation where in order to ensure that the comfort of the patient in the examination space is at an acceptable level, the temperature of the side of the gradient coil system facing the examination space is maintained at a lower level than the temperature of the core of the gradient coil system, where frequently a binding agent is present to enlarge the acoustic damping properties.

Preferably, the temperature-influencing means comprise a fluid circuit which extends through the gradient coil system to exchange energy between the fluid in the circuit and the binder material of the gradient coil system. It is important to note that such a fluid circuit can be used not only to cool the gradient coil system but also to heat said gradient coil system, more specifically to heat the binder material thereof.

An increased flexibility with respect to influencing the temperature of the gradient coil system is obtained if the fluid circuit comprises two separate circuit parts, as will be explained in greater detail with reference to the following preferred embodiment.

Preferably, the separate circuit parts meet in a joint circuit part upstream of the gradient coil system via a controllable mixing valve, the position of the mixing valve being dependent on control signals from the control means. The temperature of the fluid in the joint circuit part can thus be very rapidly adapted to the requirements, the effect being greater as the controllable measuring valve is positioned closer in front of the gradient coil system. Starting from the situation where a certain reduced temperature prevails in a first circuit part and a certain higher temperature prevails in the other circuit part, the temperature of the fluid in the joint circuit part can thus be adjusted almost instantaneously between the reduced temperature and the higher temperature.

Particularly in view of the previous preferred embodiment wherein the temperature-influencing means and the control means are arranged so as to be able to influence the temperature of respective different parts of the gradient coil system to a different degree, it is preferred that the separate circuit parts extend through different parts of the gradient coil system in order to have different temperature-influencing effects in the respective different parts of the gradient coil system.

More specifically, it may be very advantageous if one of the two circuit parts is provided primarily to influence the temperature of one or a number of sub-gradient coils, while the other of the two circuit parts is provided primarily to influence the temperature of the binding agent. It is noted that the sub-gradient coils are generally situated near the outside of the gradient coil system, while the binding agent, which is present also between the sub-gradient coils, is present particularly in the core of the gradient coil system.

With a view to maximizing the freedom with regard to the temperatures prevailing in the gradient coil system, preferably the temperature-influencing means and the control means are arranged for controlling the capacity of the separate circuit parts independently of one another. It is noted that the capacity of the temperature-influencing means depends not only on the temperature of the fluid in the fluid circuit but also on the flow rate of the fluid through said fluid circuit.

In accordance with a very advantageous preferred embodiment, the control means are arranged for controlling, on the basis of data regarding the necessary energy consumption by the gradient coil system for an image yet to be made by the MRI apparatus, the operation of the temperature-influencing means before or during the production of this image. It is thus possible to anticipate the necessary cooling capacity (instead of reacting to measured values) so that, for example, in the case of "high-power" imaging/scanning where it can be predicted that much electrical energy will be dissipated in the sub-gradient coils and the temperature of the gradient coil system, and more specifically the temperature of the binder material thereof, will show a greater tendency to rise, it is possible before such a scanning operation is performed to increase the cooling capacity, even to such a degree that the temperature of the fluid in a fluid circuit is set to a value which is so low that such a low temperature for the fluid in conjunction with a comparatively low-power scan could possibly lead to condensation problems.

According to a further preferred embodiment, the heating means comprise electrical resistance wires in the binder material. Such electrical resistance wires enable the temperature of the binder material to be increased very rapidly and effectively.

The present invention further relates to a method of operating a magnetic resonance imaging (MRI) apparatus comprising a main magnet system for generating a main magnetic field in an examination space, a gradient coil system which is situated basically between the main magnet system and the examination space and which is provided with sub-gradient coils and a binder material with a glass temperature for keeping the sub-gradient coils together, control means for controlling the temperature of the gradient coil system and temperature-influencing means for influencing the temperature of the gradient coil system on the basis of control signals originating from the control means, wherein, during operation of the MRI apparatus, the control means control the temperature of the binder material of the gradient coil system to a value above the glass temperature. The advantages offered by such a method have been explained hereinabove with reference to the explanation of the MRI apparatus according to the present invention.

These and other aspects of the invention are apparent from and will be elucidated with reference to the embodiment(s) described hereinafter.

Figure 2:
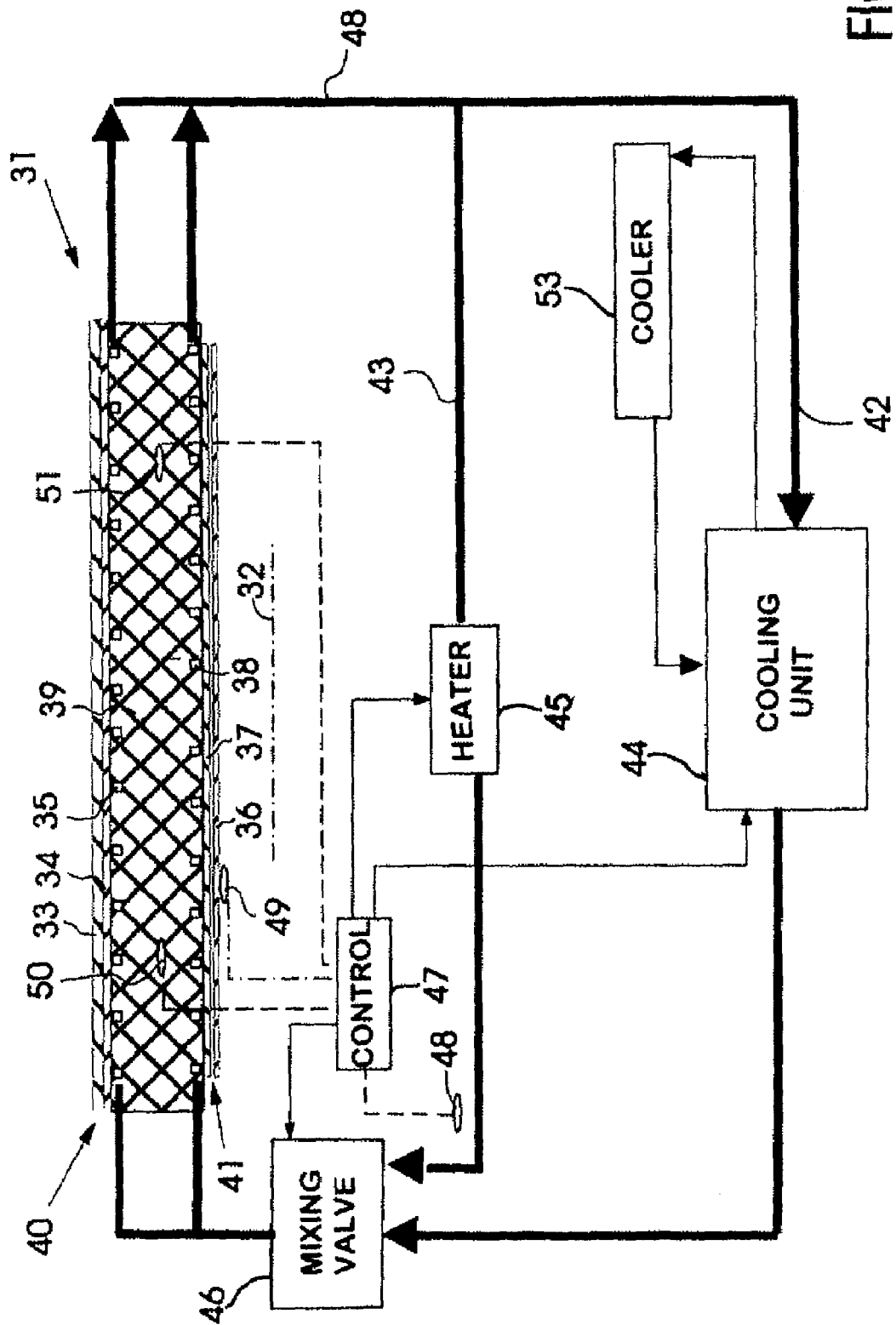
Figure 3:
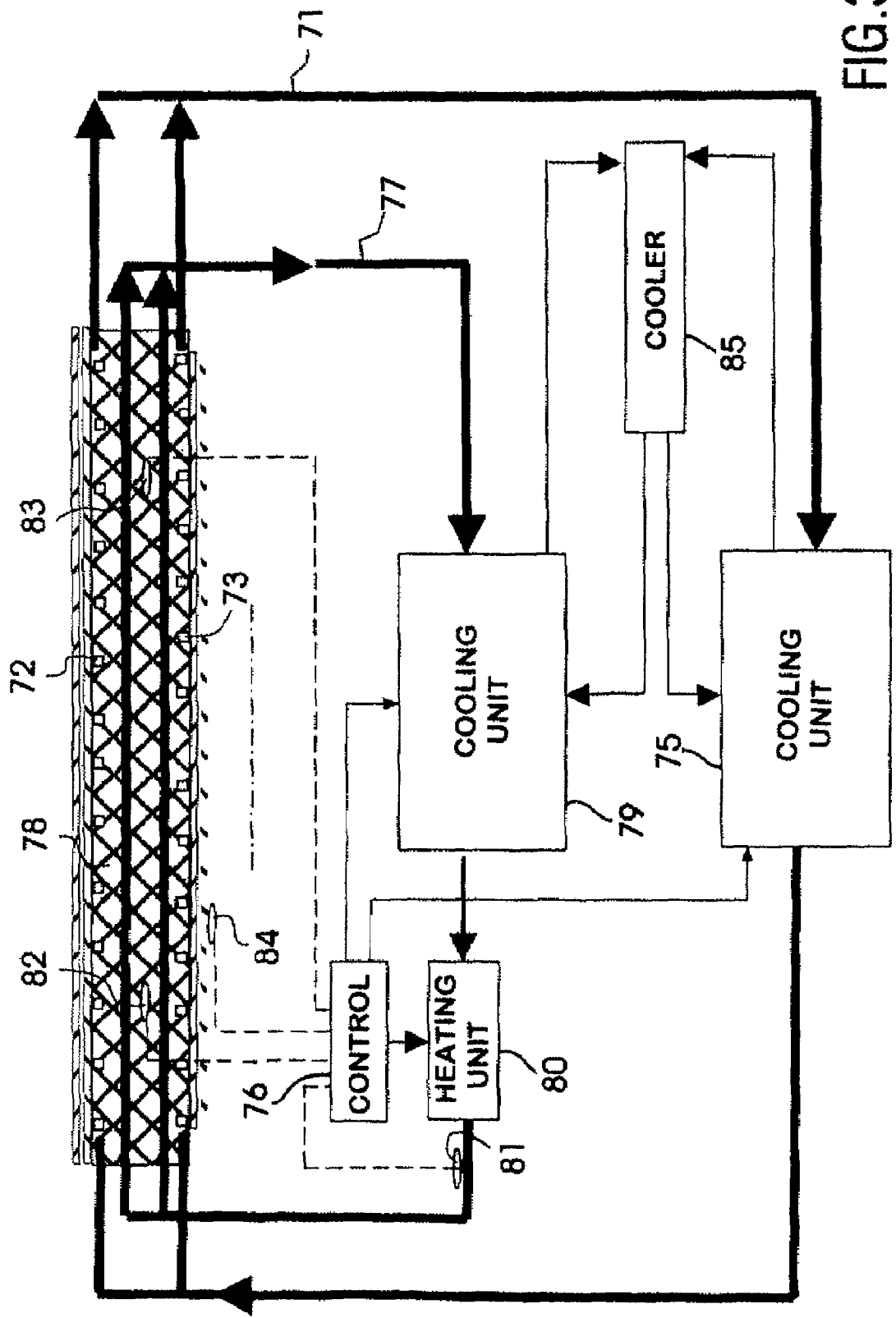
Figure 4:
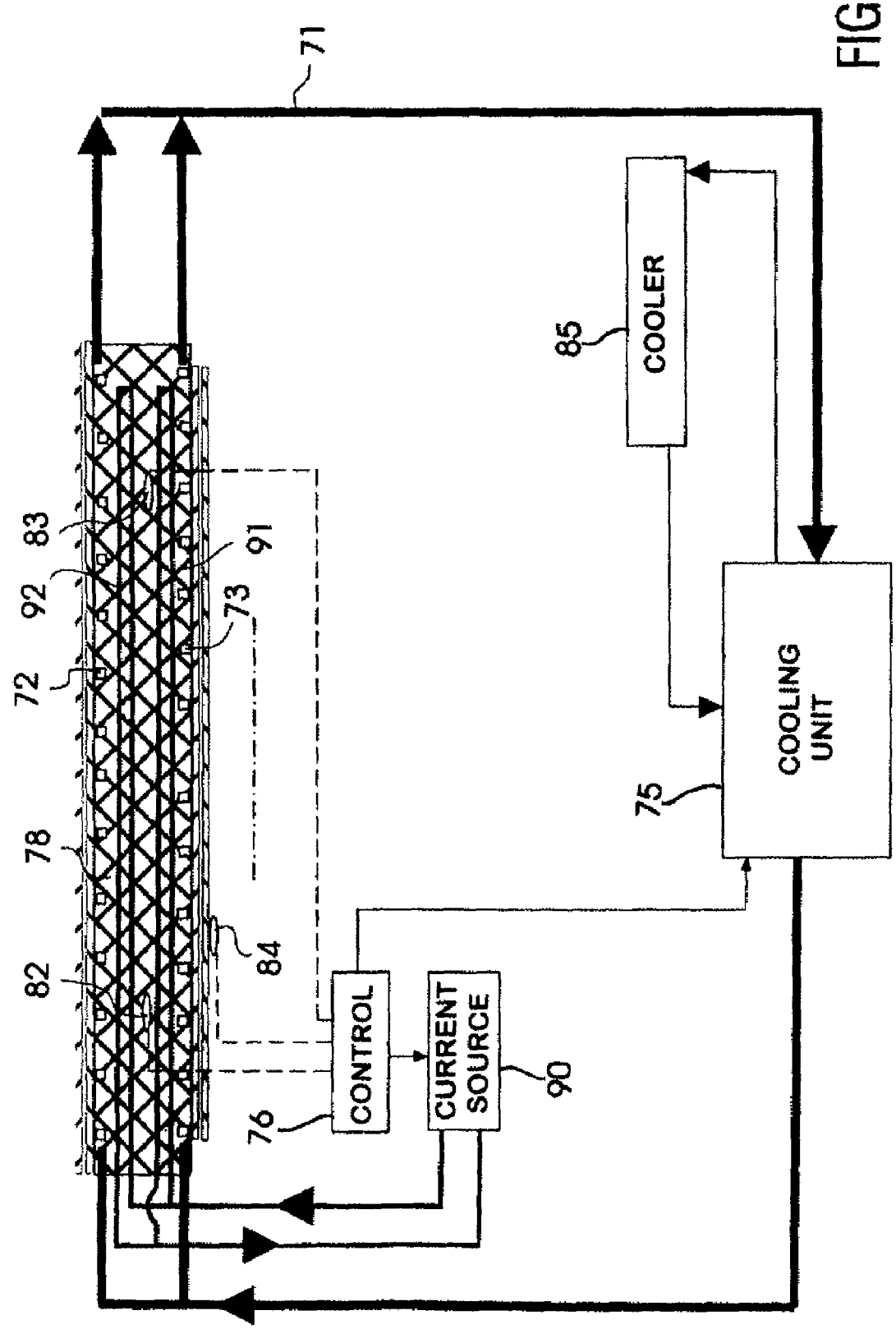

In the drawings:

FIG. 1 diagrammatically shows a first embodiment of an MRI apparatus in accordance with the invention;

FIG. 2 diagrammatically shows a second embodiment of an MRI apparatus in accordance with the invention;

FIG. 3 diagrammatically shows a third embodiment of an MRI apparatus in accordance with the invention; and FIG. 4 diagrammatically shows a fourth embodiment of an MRI apparatus in accordance with the invention.

FIG. 1 shows a gradient coil system 1 of an MRI apparatus of the closed, cylindrical type, which type is well known to those skilled in the art. The gradient coil system 1 has essentially a cylindrical shape with a center line 2, an examination space being situated on the inside of the gradient coil system 1, which examination space serves to accommodate a patient to be examined so that images of the internal organs of the patient can be produced by means of the MRI apparatus. On the outside, the gradient coil system 1 is surrounded by a main system by means of which a main magnetic field is generated within the examination space. The gradient coil system 1 basically comprises an outermost set 3 of three sub-gradient coils 4, 5, 6 and an innermost set 7 of three sub-gradient coils 8, 9, 10. Said sets 3, 7 are spaced some distance apart, the interspace being filled with a core of an epoxy resin 11 reinforced with a glass fiber material or the like, which material is also present between the sub-gradient coils and interconnects and positions these sub-gradient coils. The glass temperature of the epoxy resin 11 is 40° C.

The sub-gradient coils 8, 9, 10 serve to superpose a magnetic gradient field in three orthogonal directions onto the main magnet field within the examination space. The sub-gradient coils 4, 5, 6 serve to shield the magnetic gradient fields generated by the sub-gradient coils 8, 9, 10 from the main magnet. The sub-gradient coils 4, 5, 8, 9 consist of essentially saddle-shaped elements which jointly define a cylinder shape, whereas the sub-gradient coils 6, 10 each comprise a spirally wound hollow tube.

The cavities of these tubes of the sub-gradient coils 6, 10 form part of a fluid circuit 12 which consists, at the location of the sub-gradient coils 6, 10, of two parallel circuit parts 12a, 12b for each of the sub-gradient coils 6, 10. A fluid is passed through the fluid circuit 12 by means of pump means (not shown). Provided the temperature of the fluid and of the gradient coil system 1 are different, an energy exchange takes place within the gradient coil system 1, so that the temperature of the gradient coil system 1 can thus be influenced. In order to do this in a desirable manner, a control unit 13 is provided which controls a cooling unit 17 and a heating unit 18 on the basis of measured data regarding the temperature of the fluid in the fluid circuit 12, which data originates from thermocouples. The cooling unit 17 and the heating unit 18 form part of the fluid circuit 12. Within said cooling unit 17, the fluid circuit 12 forms a first side of a heat exchanger, and closed cooling circuit 19 in which a cooler 20 is incorporated forms the second side.

In conformity with the present invention, the control unit 13 is arranged such that the temperature of the epoxy resin 11 of the gradient coil system 1 adopts a value above 40° C. (being the glass temperature of the epoxy resin), for example a value of 45° C. The temperature of the epoxy resin 11 must not exceed a maximum value however due to the risk that the epoxy material 11 may no longer be sufficiently capable of keeping the sub-gradient coils 4, 5, 6, 8, 9, 10 together if the temperature is too high. As a result of the change which takes place when the glass temperature is passed, the epoxy resin II has substantial damping properties with respect to vibrations of the sub-gradient coils 4, 5, 6, 8, 9, 10 and of the supporting structure at a temperature above 40° C.

The temperature of the epoxy resin 11 of the gradient coil system 1 can, in principle, be measured directly by thermocouples connected to the epoxy resin 11 of the gradient coil system 1, however, it can also be determined by means of measurements of the temperature of a fluid at the input of the gradient coil system 1 by a thermocouple 16, and at the output of gradient coil system 1 by thermocouples 14, 15, use being made of a suitable model which may or may not be empirically determined.

FIG. 2 shows a gradient coil system 31 of an MRI apparatus of the closed, cylindrical type having a center line 32 within the examination space thereof. Said gradient coil system largely corresponds to the gradient coil system 1 shown in FIG. 1 and is provided with an outermost set 40 of three sub-gradient coils 33, 34, 35 and an innermost set 41 of three gradient coils 36, 37, 38, which sub-gradient coils are embedded in and kept together by epoxy resin material 39. To influence the temperature of the gradient coil system 31, a fluid circuit 48 is provided which extends partly through the cavities of the spiral-shaped sub-gradient coils 35, 38.

The control system used for this purpose differs from the embodiment shown in FIG. 1 in that, inter alia, the fluid circuit 48 also includes two parallel circuit parts 42, 43, which are situated outside the gradient coil system. Circuit part 42 comprises a cooling unit 44 which is cooled by a cooler 53 and which ensures that the temperature of the fluid leaving the cooling unit 44 has a comparatively low value of, for example, 5° C. Circuit part 43 comprises a heating unit 45 which ensures that fluid leaving the heating unit 45 has a comparatively high value of, for example, 70° C. The two circuit parts 42, 43 meet at a comparatively short distance in front of the gradient coil system 31 at the location of a controllable mixing valve 46 which enables the ratio between the amount of fluid originating from circuit part 42 on the one hand and the amount of fluid originating from circuit part 43 on the other hand to be adjusted via the position of the mixing valve. The position of the mixing valve 46 is controlled by control signals originating from control unit 47 which determines, at least by means of the temperature measurements via thermocouples 48, 49, 50, 51, what the position of the mixing valve 46 must be in order to obtain a temperature of at least 40° C. for the epoxy material of the gradient coil system. Thermocouples 50, 51 are situated in the core of the epoxy resin material 39, so that the temperature thereof can be directly determined. Thermocouple 49 is situated on the side of the gradient coil system facing the examination space. The temperature at said location is important, in particular, to preclude that a patient in the examination space is exposed to unacceptable radiant heat originating from the gradient coil system 31.

In addition, it is conceivable within the scope of the present invention that the control signals from control unit 47 to mixing valve 46 also depend on information regarding an image to be produced. Before an image is produced it is known, in principle, how much energy will be released in the gradient coil system 31 due to the electric currents flowing through the sub-gradient coils, as a result it is possible, for example, in the case of a comparatively "high-power" imaging operation in which, in principle, a more than average temperature increase of the gradient coil system 31 can be expected, to anticipate this by using a specially reduced temperature or at least an increased cooling capacity (which can also be achieved by increasing the flow rate of the fluid) for the fluid within the fluid circuit 48 when it enters the gradient coil system 31. In the case of a comparatively "low-power" scanning operation, the use of such an increased cooling capacity could give rise to condensation on the outside surfaces of the gradient coil system 31.

The application of the mixing valve 46, particularly because it is situated directly in front of the gradient coil system 31, enables the temperature of the fluid entering the gradient coil system 31 to be varied very rapidly between the respective temperatures in the two circuit parts 42, 43 preceding the mixing valve 46. This may be favorable, notably, at the start of the imaging process since, prior to said process, it might be needed to heat up the gradient coil system 31 in order to make the epoxy resin 52 of the gradient coil system adopt a temperature above 40° C., whereas shortly after the start of the imaging process, the gradient coil system 31 needs to be cooled to preclude that the temperature thereof rises to undesirably high values. Immediately after an image has been produced, the temperature of the fluid entering the gradient coil system 31 must increase rapidly in order to preclude too low a temperature of the gradient coil system 31 and hence condensation.

The embodiment shown in FIG. 3 comprises a second fluid circuit 77 besides the fluid circuit 71 which extends through the hollow, spiral-shaped sub-gradient coils 72, 73 of gradient coil system 74 and which comprises a cooling unit 75 controlled by control unit 76. This second fluid circuit 77 extends through the epoxy resin 78 of the gradient coil system 74. The second fluid circuit 77 comprises a second cooling unit 79 as well as a heating unit 80. The cooling units 75 and 79 are cooled by means of a cooler 85. The capacities of the second cooling unit 79 and of the heating unit 80 are controlled via a control unit 76, partly in dependence upon temperature measurements by thermocouples 81, 82, 83, 84. An important advantage which can be achieved by means of such an embodiment resides in the fact that the temperature of the gradient coil system 74 can be controlled such that a distinction can be made between various parts thereof. Consequently, it is possible to make, for example, the epoxy resin 78 in the middle of the gradient coil system 74 adopt a substantially higher temperature than, for example, the side of the gradient coil system 74 facing the examination space.

The embodiment shown in FIG. 4 partly corresponds to the embodiment shown in FIG. 3. Therefore, where applicable, in FIG. 4 the same reference numerals are used as in FIG. 3, and a more detailed explanation thereof within the scope of the description of FIG. 4 is dispensed with. The most important difference between the embodiments shown in FIG. 3 and FIG. 4 resides in that the second fluid circuit 77 used for influencing the temperature of, notably, the epoxy resin 78, more specifically the core thereof, is replaced by an electrical heating system which uses a current source 90. A current circuit is connected to the current source 90, which current circuit extends partly through the core of the epoxy material 78 and is formed there by electric resistance wires which, upon passage of a suitable current through said resistance wires, produce heat and thus are capable of heating up the epoxy material 78. The resistance wires extend within the epoxy material 78 basically in the form of two loops 91, 92, the wire leading to the current source and the return wire being provided so as to be paired together, for example wound together, to preclude that the resistance wires themselves can generate image-disturbing magnetic fields. Of course, within the scope of the present invention, more than two loops or a single loop may alternatively be applied.

Hereinabove, the invention has been explained by means of embodiments which are not to be construed as limiting the scope of the present invention. Innumerable variations are possible within the scope of the invention. For example, instead of a fluid circuit that forms part of a sub-gradient coil, use can alternatively be made of a separate cooling/heating line which extends, for example, between two layers of sub-gradient coils. In addition, heating of a gradient coil system, if necessary, can be achieved by employing heating elements which are formed by the sub-gradient coils themselves which function as electrical resistance heating elements when they are not used to produce an image, instead of heating a gradient coil system by passing a warm fluid through the gradient coil system or by using separate electrical resistance heating elements which are incorporated in the gradient coil system.

The invention claimed is:

1. A magnetic resonance imaging (MRI) apparatus comprising:

a main magnet system for generating a main magnetic field in an examination space;

a gradient coil system which is substantially situated between the main magnet system and the examination space and which is provided with sub-gradient coils and a binding material having a glass temperature for keeping in the sub-gradient coils together;

control means for controlling the temperature of the gradient coil system; and temperature-influencing means for influencing, on the basis of control signals originating from the control means, the temperature of the gradient coil system;

wherein the control means are arranged for controlling, during operation of the MRI apparatus, the temperature of the binding material of the gradient coil system to a value above the glass temperature; and, wherein the temperature-influencing means and the control means are arranged so as to be able to influence, to a different degree, the temperature of respective, different parts of the gradient coil system.

2. The MRI apparatus as claimed in claim 1, wherein the temperature-influencing means comprise a fluid circuit which extends through the gradient coil system to exchange energy between the fluid in the circuit and the binder material of the gradient coil system.

3. The MRI apparatus as claimed in claim 2, wherein the fluid circuit comprises two separate circuit parts.

4. The MRI apparatus as claimed in claim 3, wherein the separate circuit parts extend through different parts of the gradient coil system.

5. The MRI apparatus as claimed in claim 4, wherein one of the two circuit parts is provided primarily to influence the temperature of one or a number of sub-gradient coils, while the other of the two circuit parts is provided primarily to influence the temperature of the binding agent.

6. The MRI apparatus as claimed in claim 3, wherein the temperature-influencing means and the control means are arranged for controlling the capacity of the separate circuit parts independently of one another.

7. The MRI apparatus as claimed in claim 1, wherein the temperature-influencing means comprise:

electrical resistance wires in the binder material to heat the binder material.

8. The MRI apparatus as claimed in claim 7, further including:

a fluid circuit including a cooling unit, the fluid circuit extending through the gradient coil system to cool the binder material.

9. A magnetic resonance imaging (MRI) apparatus comprising:

a main magnet system for generating a main magnetic field in an examination space;

a gradient coil system which is substantially situated between the main magnet system and the examination space and which is provided with sub-gradient coils and a binding material having a glass temperature for keeping the sub-gradient coils together;

control unit for controlling the temperature of the gradient coil system; and temperature-influencing unit for influencing on the basis of control signals originating from the control unit the temperature of the gradient coil system;

wherein the control unit is arranged for controlling, during operation of the MRI apparatus, the temperature of the binding material of the gradient coil system to a value above the glass temperature;

wherein the temperature-influencing unit comprises a fluid circuit which extends through the gradient coil system to exchange energy between the fluid in the circuit and the binder material of the gradient coil system; and wherein the fluid circuit comprises two separate circuit parts, the separate circuit parts meeting in a joint circuit part upstream of the gradient coil system via a controllable mixing valve, the position of the mixing valve being dependent on control signals from the control unit.

10. The MRI apparatus as claimed in claim 9, wherein the value of the glass temperature is at least 30° C.

11. The MRI apparatus as claimed in claim 9, wherein temperature-influencing means comprise:
 a heating means which supplies heated fluid to the mixing valve; and,
 a cooling unit which supplies cooled fluid to the mixing valve.

12. A magnetic resonance imaging (MRI) apparatus comprising:
 a main magnet system for generating a main magnetic field in an examination space;
 a gradient coil system which is substantially situated between the main magnet system and the examination space and which is provided with sub-gradient coils and a binding material having a glass temperature for keeping the sub-gradient coils together;
 temperature-influencing unit which influences the temperature of the gradient coil system; and
 a the control unit arranged for controlling, on the basis of data regarding the projected energy consumption by the gradient coil system for an image yet to be made by the MRI apparatus, the operation of the temperature-influencing unit before or during the production of this image to control the temperature of the binding material of the gradient coil system to a value above the glass temperature.

13. The MRI apparatus as claimed in claim 12, wherein the temperature-influencing unit and the control unit are arranged to influence the temperature of different parts of the gradient coil system to a different degree.

14. The MRI apparatus as claimed in claim 12, wherein the temperature-influencing unit further includes:
 a fluid circuit including a fluid circuit part which extends through the gradient coil system;
 a mixing valve connected with the fluid circuit part that extends through the gradient coil system;
 a heating unit which supplies heated fluid to the mixing valve; and
 a cooling unit which supplies cooled fluid to the mixing valve.

15. The MRI apparatus as claimed in claim 12, wherein the temperature-influencing unit includes:
 electrical resistance heating elements disposed in the binder material; and
 a fluid circuit extending through the gradient coil system for circulating a temperature control fluid through the gradient coil system.

16. A method of operating a magnetic resistance imaging (MRI) apparatus comprising a main magnet system for generating a main magnetic field in an examination space, a gradient coil system which is situated basically between the main magnet system and the examination space and which is provided with sub-gradient coils and a binder material with a glass temperature for keeping the sub-gradient coils together, a control unit which controls the temperature of the gradient coil system and temperature-influencing unit which influences the temperature of the gradient coil system on the basis of control signals originating from the control means, the method comprising:
 during operation of the MRI apparatus, controlling to a different degree the temperature of the binder material of different parts of the gradient coil system to temperature above the glass temperature.

17. The method as claimed in claim 16, further including:
 electrically heating the binder material to increase temperature and fluidicly cooling the binder material to reduce temperature.

18. The method as claimed in claim 16, wherein the temperature-influencing unit includes a plurality of fluid circuit parts extending through each of a plurality of portions of the gradient coil system and wherein the method includes:
 supplying different temperatures of fluid to different fluid circuit parts to control the temperature of the binder differently in different pans of the gradient coil system independently.

19. The method as claimed in claim 16, further including:
 determining energy consumption by the gradient coil system for an MRI procedure to be conducted;
 controlling the temperature of the binder material in accordance with the determined energy consumption before as well as during the conducting of the MRI procedure.

* * * * *